United States Patent
Mulder et al.

(10) Patent No.: US 6,737,662 B2
(45) Date of Patent: May 18, 2004

(54) LITHOGRAPHIC APPARATUS, DEVICE MANUFACTURING METHOD, DEVICE MANUFACTURED THEREBY, CONTROL SYSTEM, COMPUTER PROGRAM, AND COMPUTER PROGRAM PRODUCT

(75) Inventors: Heine Melle Mulder, Eindhoven (NL); Jan Bernard Plechelmus Van Schoot, Eindhoven (NL); Markus Franciscus Antonius Eurlings, Breda (NL); Antonius Johannes Josephus Van Dijsseldonk, Hapert (NL); Marcel Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/157,033

(22) Filed: May 30, 2002

(65) Prior Publication Data

US 2003/0038225 A1 Feb. 27, 2003

(30) Foreign Application Priority Data

Jun. 1, 2001 (EP) .............................. 01304850

(51) Int. Cl.⁷ .............................. G01N 21/86
(52) U.S. Cl. ....................... 250/548; 250/205
(58) Field of Search ................. 250/548, 559.3, 250/559.4, 216, 201.5, 205; 356/399, 400, 401; 355/53, 67, 55

(56) References Cited

U.S. PATENT DOCUMENTS 6,193,393 B1    2/2001   Dove et al. .................. 362/251
6,597,431 B2 *  7/2003   Benschop et al. ............ 355/69

FOREIGN PATENT DOCUMENTS

| EP | 0 486 316 A2 | 5/1992 |
| EP | 0 744 641 A2 | 11/1996 |
| JP | 6-291023 | 10/1994 |
| JP | 8-313842 | 11/1996 |
| JP | 9-298154 | 11/1997 |
| JP | 11-3849 | 1/1999 |

* cited by examiner

Primary Examiner—Que T. Le
(74) Attorney, Agent, or Firm—Pillsbury Winthrop LLP

(57) ABSTRACT

A lithographic projection system has an illumination system. A plurality of directing elements reflect different sub-beams of an incident projection beam into adjustable, individually controllable directions. By using of re-directing optics any desired spatial intensity distribution of the projection beam can be produced in its cross-sectional plane.

23 Claims, 8 Drawing Sheets

LITHOGRAPHIC APPARATUS, DEVICE MANUFACTURING METHOD, DEVICE MANUFACTURED THEREBY, CONTROL SYSTEM, COMPUTER PROGRAM, AND COMPUTER PROGRAM PRODUCT

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

Another example of a pattering device is a programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792, incorporated herein by reference.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

A projection apparatus, such as used in lithography, generally includes an illumination system, referred to hereafter simply as an illuminator. The illuminator receives radiation from a source, such as a laser, and produces a projection beam for illuminating an object, such as the patterning device (e.g. a mask on a mask table). Within a typical illuminator, the beam is shaped and controlled such that at a pupil plane the beam has a desired spatial intensity distribution. This spatial intensity distribution at the pupil plane effectively acts as a virtual radiation source for producing the projection beam. A Following a first pupil plane, the radiation is substantially focused by a lens group referred to hereafter as "coupling Lens". The coupling lens couples the substantially focused radiation into an integrator, such as a quartz rod. The function of the integrator is to improve the homogeneity of the spatial and/or angular intensity distribution of the projection beam. The spatial intensity distribution at the pupil plane is converted to an angular intensity distribution at the object being illuminated by the coupling optics, because the pupil plane substantially coincides with the front focal plane of the coupling optics. Controlling the spatial intensity distribution at the pupil plane can be done to improve the processing latitudes when an image of the illuminated object is projected onto a substrate. In particular, spatial intensity distributions with dipole, annular or quadrupole off-axis illumination profiles have been proposed to enhance the resolution and other parameters of the projection, such as sensitivity to projection lens aberrations, exposure latitude and depth of focus.

A known illuminator comprises an optical system referred to hereafter as "zoom-axicon". The zoom-axicon is a device that adjusts the intensity distribution at the pupil plane. Radiation from the source passes through a first optical element such as, for example, a diffractive optical element (DOE), which generates an angular intensity distribution. Next, the radiation beam traverses a zoom lens. In the back focal plane of the zoom lens a spatial intensity distribution occurs that generally is suitable to serve as a secondary light source in the pupil plane. Hence the back focal plane of the zoom lens typically substantially coincides with the pupil plane (i.e. the front focal plane of the coupling optics). The outer radial extent of the spatial intensity distribution at the pupil plane can be changed by changing the focal length of the zoom lens. However, the zoom lens must have two degrees of freedom, one to change the focal length of the zoom lens and a second to change the position of the principal planes such that when the focal length changes, the back focal plane remains located at the pupil plane of the illuminator. Due to this functionality, the zoom lens typically consists of several (e.g. at least three) separate lenses in series, several of which are movable. As mentioned above, by tuning the focal length of the zoom lens, the radial extent of the intensity distribution at the pupil plane can be set. In the following, any preselected, preferred spatial intensity distribution at the pupil plane may be referred to as an "illumination setting".

An axicon, which is located near the pupil plane, generally consists of two elements having complimentary conical shaped faces. The axicon is used to generate annular spatial intensity distributions, or other spatial intensity distributions with substantially no intensity around their center, i.e. no on-axis illumination. By tuning the distance between the two conical faces of the axicon, the annularity can be adjusted. When the axicon is closed, i.e. the gap between the conical faces is zero, conventional, (i.e. disc-like) illumination settings can be produced. With a gap between the conical faces, an annular intensity distribution results, with the inner radial extent of the annulus determined by the distance between the two conical faces. On the other hand the zoom lens determines the outer radial extent and thus the width of the annulus. Preselected inner and outer radial extents of the intensity distribution are often referred to as σ-settings, in particular the σ-inner settings and the σ-outer setting, respectively. Here, σ-inner and σ-outer are a measure for the ratio of the radius in question to the maximum radius of the pupil.

The term "zoom-axicon" as employed here should be interpreted as referring to a module comprising a zoom lens and an axicon.

Multiple illumination settings can be generated by various device in the known illuminator, for example by modifying the first optical element in front of the zoom lens, such as to appropriately shape the angular intensity distribution, or by inserting aperture plates or blades into the beam path, for instance near a pupil plane, and so on. Further information on a known zoom-axicon module and multipole mode generation are given (for example) in U.S. Pat. No. 6,452,662, incorporated herein by reference.

In the known illuminator, described above, it is apparent that to produce the desired range of illumination settings the zoom-axicon module will generally have several (e.g. five or more) optical components, which can make it expensive to produce, particularly given the fact that several of the elements must be independently movable. A further problem is that the lenses comprising the zoom lens and the two conical elements of the axicon represent a considerable thickness of lens material and a large number of surface interfaces. This means that the transmission efficiency can be poor due to absorption, reflection, inefficient coatings, degradation effects and contamination. This problem is exacerbated by the demand for imaging ever smaller features at higher densities, which requires the use of radiation with shorter wavelengths, such as 193, 157, 126 nm or even EUV (e.g. 5–20 nm). The efficiency of suitable transmissive materials, such as $CaF_2$ and quartz, decreases at shorter wavelengths due to increased absorption and no materials are known that are sufficiently transmissive for EUV radiation. The effectiveness of the optical coatings of the components also typically decreases at shorter wavelengths and degradation effects generally become worse. Thus, overall, a significant throughput reduction can occur, due to decreased transmission. Another problem is that the known illuminator occupies a relatively large volume in the lithography apparatus. This in turn can lead to excess bulk in the machine, and increased manufacturing costs (particularly when using material such as $CaF_2$).

As mentioned above, spatial intensity distributions with dipole, annular or quadrupole off-axis illumination profiles can enhance the projection properties. The choice of the profile depends on, amongst others, the respective application of the lithographic process. To provide a desired non-standard illumination mode for a given application, requires dedicated optical devices which must be specially designed at considerable effort and expense.

EP 0 744 641 A describes an illumination system for use in a lithography apparatus which uses a deformable mirror to improve the uniformity of illumination of the mask.

EP 0 486 316 A describes various different lithography apparatus including a variety of different arrangements for providing dipole and quadrupole illumination settings. These include arrangements using fiber bundles whose exit points are moveable to define the pole positions. Other arrangements use a mirror shiftable between two positions during an exposure or between shots of a multishot exposure.

SUMMARY OF THE INVENTION

An aspect of the present invention is to provide an improved lithography apparatus with an illuminator which avoids or alleviates the above problems. A further object is to provide devices which can be used to generate nearly any desired intensity distribution of the projection beam.

According to one aspect of the present invention there is provided a lithographic apparatus including a radiation system to provide a projection beam of radiation; a support structure for supporting a patterning device, the patterning device serving to pattern the projection beam according to a desired pattern; a substrate table to hold a substrate; a projection system to project the patterned beam onto a target portion of the substrate; wherein the radiation system comprises an illumination system configured to define the intensity distribution of the projection beam, wherein the illumination system comprises a steering device to individually steer different parts of an incoming beam into different directions to provide a desired angular intensity distribution of the projection beam at the patterning device, the steering device comprising a plurality of discrete mirrors, each for steering a part of the incoming beam and whose orientation can be controlled individually to direct the corresponding part of the incoming beam into a desired direction.

Another aspect of the present invention the plurality of discrete mirrors. Preferably, the discrete mirrors can be controlled to direct their corresponding part of the incoming beam into (substantially) any desired direction. The resulting angular intensity distribution can then be transformed into a spatial intensity distribution, for example by a focusing lens. Examples for a directing element are a reflecting element, which reflects the incident radiation into a direction or range of directions, and a diffractive element, which diffracts and thereby diverges the incident radiation. Any other type of element which is capable of directing radiation into a specific direction or range of directions or into plural directions can be used as a directing element, as long as the direction or the directions can be controlled. The control can be performed by any suitable way, for example mechanically to orient the directing element and/or electrically to directly or indirectly change the directing properties and/or the orientation of the directing element. Other methods for influencing the directing element and thereby setting the direction or directions are possible, such as methods using electromagnetic radiation or fields.

In recent times, micro-electromechanical and micro-opto-electro-mechanical systems (MEMS and MOEMS) have been developed for use as optical switches in devices for optical data transmission. Some of these MEMS comprise arrays with more than 1000 microscopic mirrors wherein each of the mirrors can be tilted in two different planes perpendicular to each other. Thus, radiation incident on such devices can be reflected into (substantially) any desired direction of a hemisphere. Such an array of reflective elements can be used as the plurality of discrete mirrors and are individually oriented to reflect projection radiation into different pre-determined directions.

An important advantage of the present invention lies in the fact that it can be applied to EUV radiation to provide desired intensity distributions. It has up to now not been possible to provide a zoom-axicon or equivalent device that would function with EUV radiation.

In a particular embodiment of the invention, the steering device includes a first faceted mirror, each of the discrete mirrors being a facet of the first faceted mirror and serving to project an image of a radiation source onto a selected facet of a second faceted mirror by control of the orientation thereof. In this arrangement, the first faceted mirror acts as a field mirror and a fly's-eye reflector, creating a large number of virtual sources on the second faceted mirror which are then redirected to overlap on the mask, providing the desired uniformity of illumination. Preferably, the second faceted mirror is in a plane conjugate with a pupil plane of the projection system so that the illumination of the second faceted mirror determines the illumination mode of the mask. Thus, the illumination mode can be controlled by controlling the orientation of the facets of the first faceted mirror to illuminate selected ones of the facets of the second faceted mirror. This avoids the loss of beam intensity that would occur if the illumination mode is set by selective masking in a pupil plane.

The present invention is not limited to the case that the radiation system provides a single projection beam of radiation. Rather, different sub-beams or bundles of sub-beams can be generated at different locations and can be steered by the steering device to produce the desired angular intensity distribution. Furthermore, the projection beam or at least one of the projection beams can be split up to form separate sub-beams before reaching the directing elements. This means that the angular intensity distribution may be somewhat influenced by the manner in which the projection beam or projection beams is generated or manipulated before reaching the directing elements, but the control of the directing elements enables the user to produce the desired angular intensity distribution by choosing from a wide range of possible distributions. In particular, it is preferred that the directing elements can be controlled to direct each incident part of the projection radiation into (substantially) any direction of a hemisphere.

As described above, a desired spatial intensity distribution is to be produced in some cases. In these cases, it is preferred to produce a corresponding angular intensity distribution and to use a re-directing element to at least a part of the steered projection beam to produce the desired spatial intensity distribution in a cross-section of the projection beam, in particular in a focal plane. In particular, if focusing optical elements are used, such as a convex lens, each of the different directions of radiation propagation (of the produced angular intensity distribution) corresponds to one particular area of the spatial intensity distribution, in particular to one specific local point in a focal plane.

Different shapes and/or profiles of such a spatial intensity distribution such as annular, quadrupole, dipole and (soft) multipole, have been proposed. The present invention enables the user of a lithographic projection apparatus to produce any desired spatial intensity distribution, for example with arbitrary, definable shapes.

According to a preferred aspect of the invention, at least some of the sub-beams are steered and re-directed so that they correspond to spots or dashes of radiation in the cross-section in which the spatial intensity distribution is defined. Thus, the spatial intensity distribution has a profile with a discrete character. Depending on the size of the spots and/or dashes, and thereby depending on the size of the range of directions into which a single sub-beam is steered by the steering device, the spatial intensity distribution can comprise zones where the intensity is zero or almost zero (non-illuminated or dark zones) between illuminated areas.

In a preferred embodiment, the range of directions into which a single sub-beam propagates is influenced so that there is a sufficiently continuous intensity distribution. It is possible to influence the respective sub-beam or beams before the beam reaches the directing element and/or afterwards. In one particular embodiment, the sub-beams are steered so that they each propagate essentially to a single point. The points can be the same or different for the different sub-beams. One advantage of this embodiment is that the sub-beam can easily be adjusted to be incident on the directing element in the correct place. Further, undesired boundary effects due to radiation which is incident at the boundaries of the directing element can be reduced or avoided. For example, if the directing element is a reflective element with a given size of a reflective area, the arrangement can easily be adjusted so that the sub-beam is incident on the reflective element in the central zone of the reflective area.

To increase the range of propagation directions of the steered sub-beam, a diffuser device, such as a diffuser plate, can be used. However, this also may affect the polarization of the sub-beam and can make it difficult or impossible to exploit the polarization in subsequent stages.

In another embodiment, the sub-beam or beams are therefore manipulated before reaching the directing element or elements. In particular, the respective sub-beam is manipulated so that the steered sub-beam propagates into a defined range of propagation directions. For example, this can be done using a concentrating element to concentrate the sub-beam onto the directing element. The concentration also has the advantage that the sub-beam is incident on the directing element at the correct place, e.g. the central zone of a reflective area.

In addition or alternative to the embodiments described before, the range of propagation directions of the sub-beam or beams can be increased using the directing element or elements. In particular, the reflective surface area of a reflective element can be shaped accordingly, for example to have a convex shape.

The term "sub-beam" as here employed should not be interpreted in a limiting way regarding the intensity distribution of the beam or beams before reaching the directing elements. Rather, the respective beam can be a single beam with a continuous intensity distribution, but, at the same time, can be considered to comprise a bundle of sub-beams. At least some of the sub-beams may become individual beams, separated from other parts of the beam, after being steered by the steering device. In any case, each steered sub-beam corresponds to a related part of the originally generated projection beam or beams.

Another aspect of the invention is that a variety of intensity distributions of the projection beam can be produced without the need to design corresponding optical arrangements especially for each one particular illumination setting and/or to replace at least parts of an existing optical arrangement. In particular, intensity distributions can be produced which previously existed only in theory.

According to a further aspect of the invention there is provided a device manufacturing method including providing a substrate at least partially with a layer of radiation-sensitive material; providing at least one projection beam of radiation; modifying the intensity distribution of the projection beam; using a patterning device to endow the modified projection beam with a pattern in its cross-section; projecting the patterned beam of radiation onto a target which comprises at least a part of the radiation-sensitive material, wherein the modification of the intensity distribution of the projection beam includes controlling the direction into which the radiation propagates, wherein the projection beam comprises a plurality of sub-beams, wherein at least some of the sub-beams are steered into different directions using a plurality of directing elements, and wherein the directing elements are individually controlled to direct the corresponding sub-beam into a desired direction.

According to still a further aspect of the invention there is provided a control system for controlling the intensity distribution of a beam of radiation for use in lithography including a calculation unit for calculating, based on a given intensity distribution of the beam, the necessary modifications to be made to the given distribution to produce a desired intensity distribution; an input device to input information about the desired intensity distribution; an output device to output a plurality of control signals to a plurality of directing elements which are capable of re-directing parts of the beam; wherein the calculation unit is adapted to calculate the control signals so that the directing elements can be controlled to modify the given intensity distribution of the beam to an angular intensity distribution which corresponds to the desired intensity distribution.

The calculation unit calculates the control signals based on a given intensity distribution. In particular, the given intensity distribution is applied in a projection beam of radiation which is used repeatedly to project the same pattern onto respective radiation-sensitive areas of one or more than one substrate. In one scenario, the given intensity distribution will be the same for each projection period, which may be interrupted by time periods with no illumination of radiation-sensitive material. However, it is also possible to employ different intensity distributions one after the other, using the same plurality of directing elements. In this case, the control system outputs different sets of control signals to the plurality of directing elements in order to change the angular intensity distribution between two projection periods.

In particular if the directing elements are electrically controlled, the illumination setting can be changed very quickly, due to the small mass and inertia of single, individually controllable directing elements compared to the mass and inertia of whole sets of optical elements, such as sets of diffractive optical elements with many microlenses. Thus, it is now possible to change the illumination setting between two flashes of illumination in acceptable time and to employ different intensity distributions alternatingly on a substrate.

According to a further aspect of the present invention there is provided a control system for controlling the intensity distribution of a beam of radiation for use in lithography including a calculation unit for calculating, based on a given intensity distribution of the beam, the necessary modifications to be made to the given distribution to produce a desired intensity distribution; an input device to input information about the desired intensity distribution; an output device to output a plurality of control signals to a plurality of discrete reflectors which are capable of re-directing parts of the beam, wherein the calculation unit is adapted to calculate the control signals so that the orientation of the discrete reflectors can be controlled to modify the given intensity distribution of the radiation beam to an angular intensity distribution which corresponds to the desired intensity distribution.

The control system may also be provided with an input device to receive the actually obtained mirror positions and/or pupil distribution so as to effect a closed loop control of the minor position and/or pupil distribution. The pupil distribution may be measured as described in European Patent Application No. 00307558.7, which is hereby incorporated by reference.

According to still a further aspect of the invention there is provided a computer program for producing a desired spatial intensity distribution of a beam of radiation for use in lithography, wherein an angular intensity distribution of radiation propagation of the beam corresponds to a spatial intensity distribution in a cross-section of the beam; and a steering device can be controlled to form an angular intensity distribution for any desired spatial intensity distribution by re-directing parts of the beam; the computer program comprising a code adapted to calculate the necessary state of the steering device and/or the control signals for controlling the steering device to form the angular intensity distribution which corresponds to the desired spatial intensity distributions.

In a preferred embodiment, an arbitrary spatial intensity distribution in a cross-section of the beam can be defined and the code is adapted to calculate the necessary state of the steering device and/or the control signals to form the corresponding angular intensity distribution.

In general, it is not possible to produce any theoretically possible angular intensity distribution. In particular, if the steering device includes directing elements as described above, there will be some discrete character of the intensity distribution due to the fact that each directing element directs the corresponding part of the beam into a limited range of directions only (see above). Depending on the number of directing elements, on their characteristic properties, and other factors, the discrete character of the intensity distribution will be more or less pronounced. It is preferred that the code of the computer program take the discrete character into account and calculate the necessary state of the steering device and/or the control signals which result in the closest approximation of the angular intensity distribution which is equivalent to the desired spatial intensity distribution.

Preferably, in order to increase the number of spatial intensity distributions which can be produced by transforming the angular intensity distribution to the corresponding spatial intensity distribution, the optical elements (e.g. zoom lens) which transforms the angular intensity distribution to the spatial distribution can be modified and/or exchanged. In this case, the computer program must have access to the amended transformation behavior. In a preferred embodiment, the code is adapted to choose between different transformation arrangements and/or properties of transformation arrangements and are adapted to calculate not only the state of the steering device and/or the control signals for controlling the steering device, but are also adapted to calculate the corresponding transformation arrangement which produces the desired spatial intensity distribution. For example, the transformer may include a zoom lens and the code are then adapted to choose or calculate an appropriate value of the focal length of the zoom lens.

Alternatively, or as an added feature, it is possible that the code can choose between different arrangements for influencing the projection beam before it reaches the steering device.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, like symbols indicate like parts.

DETAILED DESCRIPTION

Figure 1:
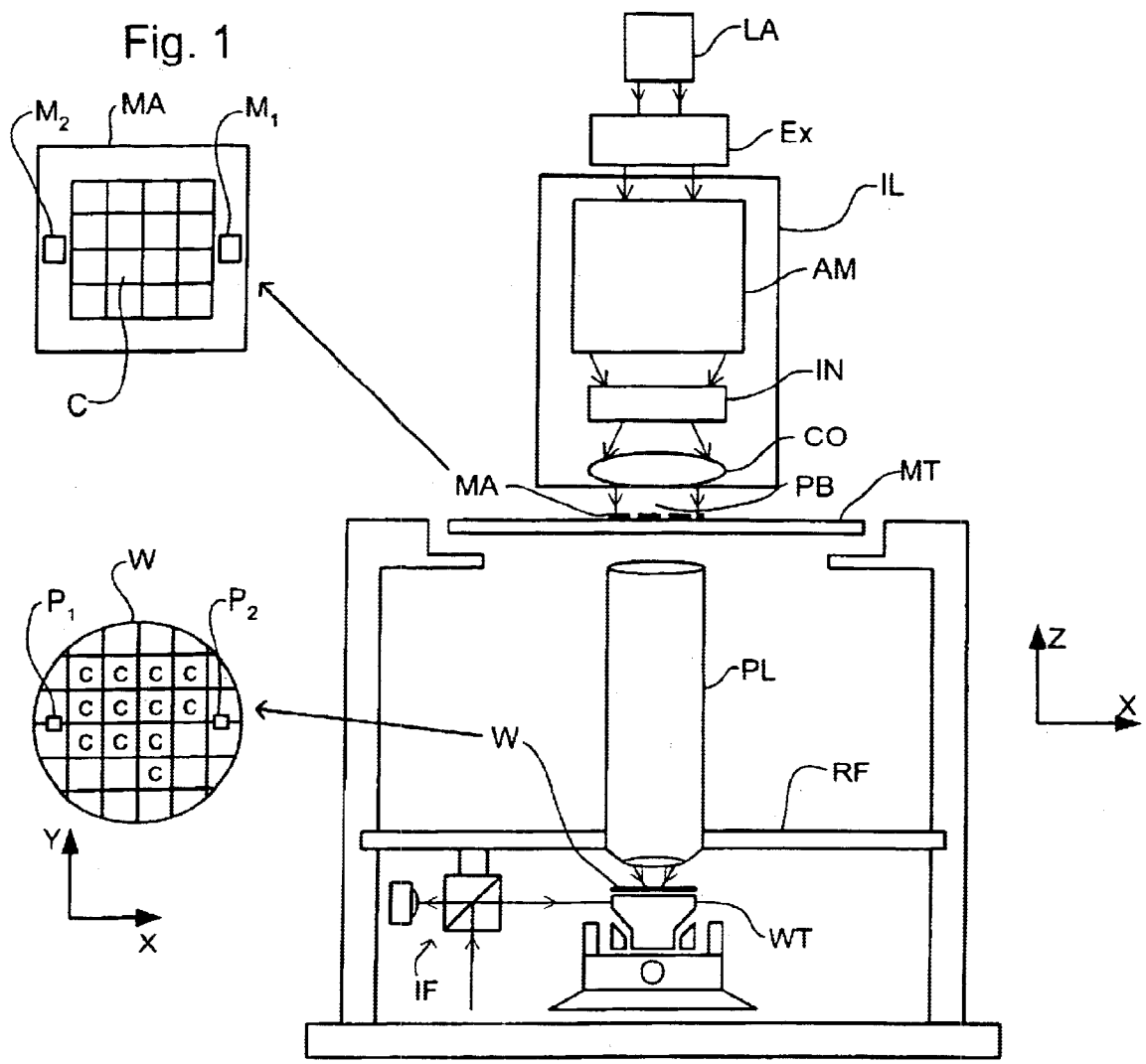
FIG. 1 depicts a lithographic projection apparatus according to a first embodiment of the invention.

FIG. 1 schematically depicts a lithographic projection apparatus according to a particular embodiment of the invention. The apparatus includes a radiation system Ex, IL, for supplying a projection beam PB of radiation (e.g. ultraviolet radiation). In this embodiment, the radiation system also comprises a radiation source LA; a first object table (mask table) MT provided with a mask holder for holding a mask MA (e.g. a reticle), and connected to a first positioning device $M_1$, $M_2$ to accurately positioning the mask with respect to a projection system PL; a second object table (substrate table) WT provided with a substrate holder for holding a substrate W (e.g. a resist-coated silicon wafer), and connected to a second positioning device to accurately positioning the substrate with respect to the projection system PL; the projection system (lens) PL supported on a reference frame RF to image an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. a laser) produces a beam of radiation. This beam is fed into an illumination system (illuminator) IL, either directly or after having traversed conditioning device, such as a beam expander Ex, for example. The illuminator IL comprises a modifying device AM to modify the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device, and an interferometer IF, the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
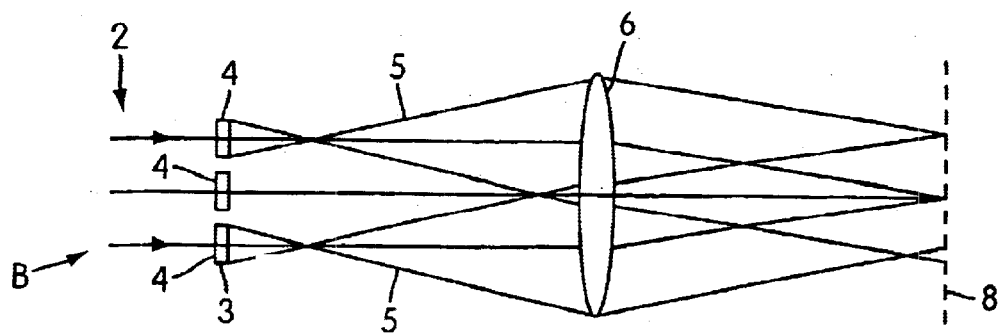
FIG. 2 schematically illustrates the transformation of an angular intensity distribution to a spatial intensity distribution according to a prior art arrangement.

FIG. 2 illustrates the principle of corresponding angular and spatial intensity distributions of a beam B. According to a prior-art arrangement, elements for setting the outer and/or inner radial extent (commonly referred to as aσ-outer and σ-inner, respectively) comprise a diffractive optical element ("DOE") 3 with an array of micro-lenses 4. Each micro-lens 4 forms a divergent pencil 5 of rays. Each pencil 5 of rays corresponds to a part or sub-beam of the beam B which is incident at the DOE 3. The pencils 5 will be incident at focusing lens 6. In the back focal plane 8 of the lens 6, each pencil 5 corresponds to an illuminated area. The size of the area depends on the range of directions into which the rays of the pencil 5 propagate. If the range of directions is small, the size of the illuminated area in the back focal plane 8 is also small. Furthermore, all identical directions of the pencils 5, i.e. all rays which are parallel to each other, correspond to one and the same particular point in the back focal plane 8.

Figure 4:
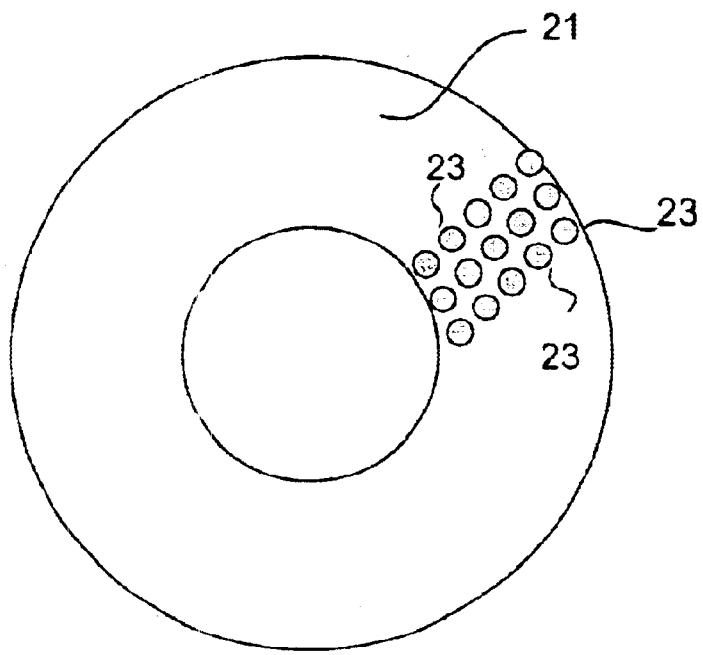
FIGS. 4 and 5 depict two similar spatial intensity distributions.
Figure 5:
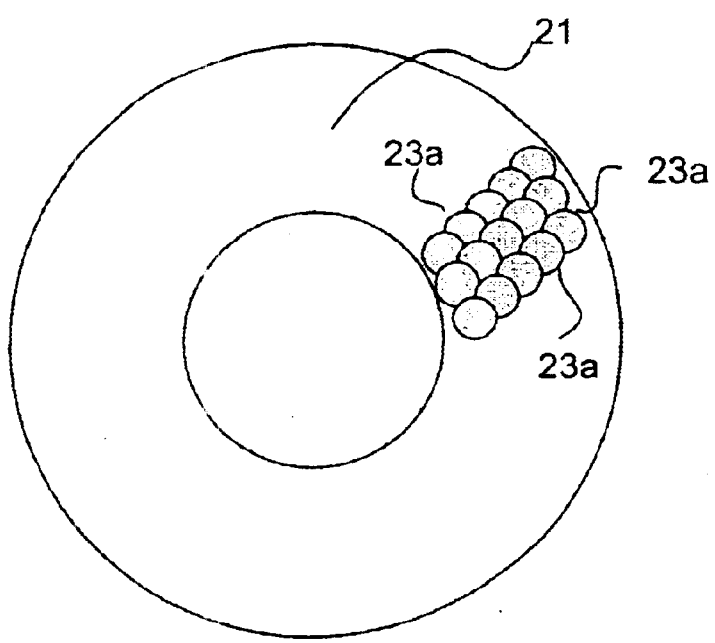

It is known to produce a spatial intensity distribution in a cross-sectional area of the beam B, in particular in a pupil plane, which has an annular shape (as illustrated in FIGS. 4 and 5 by two concentric circles). The inner radial extent which corresponds to the central area with an intensity of zero or close to zero, can be set by choosing an appropriate DOE 3. For example, all micro-lenses 4 can be oriented so that none of the pencils 5 of rays will be incident at the central area and will only be incident in the annular area (of course, in practice, there will be an intensity greater than zero in the central area, due to effects such as dispersion). By orienting the micro-lenses 4 into different directions, other spatial intensity distributions can be produced in the cross-sectional area, such as dipole or quadrupole illumination. However, the number of possible intensity distributions is limited and a change of the illumination setting requires time consuming replacement and/or re-orienting of micro-lenses.

Figure 3:
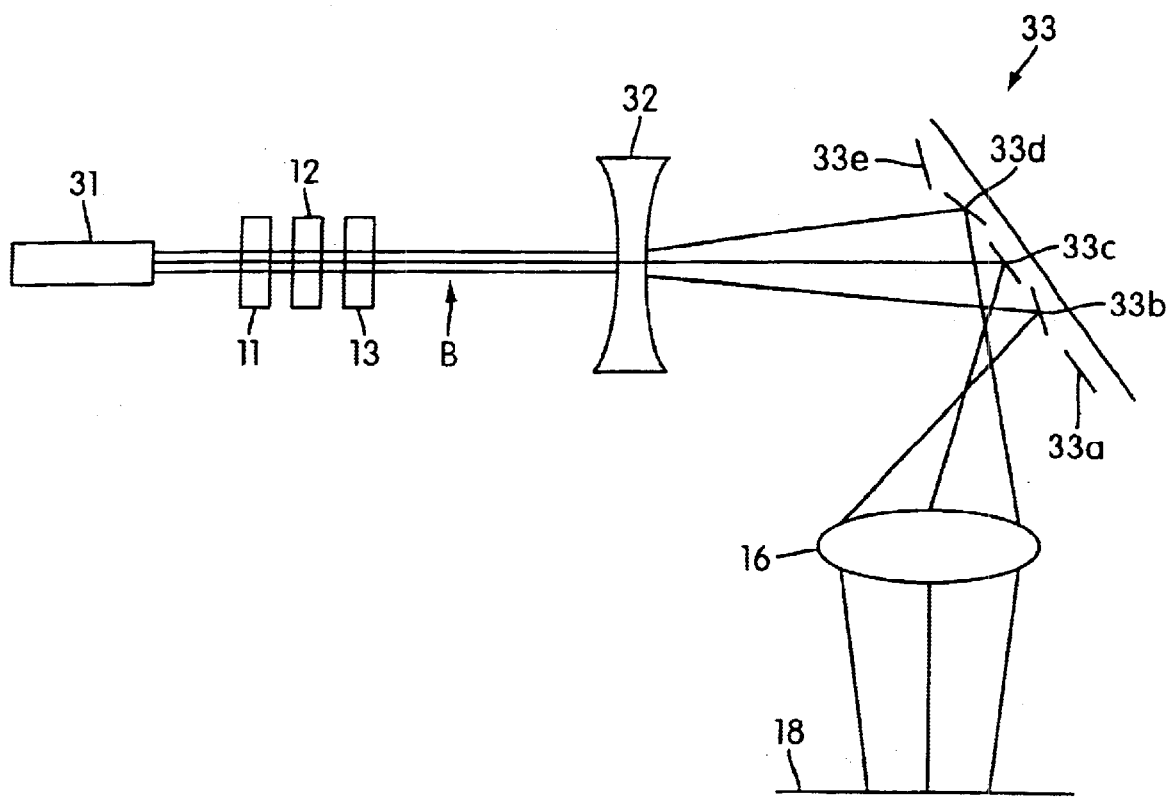
FIG. 3 shows in more detail the radiation system of the first embodiment of the invention.

FIG. 3 shows the arrangement of the radiation system according to a first embodiment of the present invention. A laser 31 outputs a relatively narrow, collimated beam which passes through shutters 11, 12, 13. It is then passed through beam divergence optics 32 which expand the beam to a size which corresponds to the size of an array 33 of reflective elements 33a, 33b, 33c, 33d, 33e. Ideally, the beam divergence optics 32 should output a collimated beam. However, at the edges of the beam there may be a divergence difference. Preferably, the size of the expanded beam is sufficient that the beam is incident at all reflective elements 33a to 33e. In FIG. 3, by way of example, three sub-beams of the expanded beam are shown. The beam divergence optics may alternatively comprise a positive lens or lens array positioned after the back focal point.

A first sub-beam is incident at reflective element 33b. Like the other reflective elements 33a, 33c to 33e of the array 33, the reflective element 33b can be controlled to adjust its orientation so that the sub-beam is reflected into a desired pre-determined direction. By re-directing optics 16, which may comprise a focusing lens, the sub-beam is re-directed so that it is incident at a desired point or small area in a cross-sectional plane 18 of the beam. The cross-sectional plane 18 may coincide with the pupil plane which acts as a virtual radiation source (as described above). The other sub-beams shown in FIG. 3 are reflected by the reflective elements 33c, 33d and re-directed by re-directing optics 16 so as to be incident at other points of plane 18. By controlling the orientations of the reflective elements 33a to 33e, almost any spatial intensity distribution in the cross-sectional plane 18 can be produced.

For example, the array 33 comprises 1152 (e.g. 32×36) mirrors and the orientation of each mirror can be adjusted separately.

FIG. 4 and FIG. 5 show different spatial intensity distributions which may be produced by an illumination system according to the invention, for example, by the illumination system described in connection with FIG. 3, FIG. 6 and/or FIG. 7. FIG. 4 and FIG. 5 should be understood as schematic diagrams which illustrate the principle of producing a spatial intensity distribution using a plurality of sub-beams. The drawing plane of FIG. 4 and FIG. 5 coincides with a cross-sectional area of the beam, for example, the cross-sectional plane 18 of FIG. 3. FIG. 4 and FIG. 5 depict fifteen small circular areas 23 or 23a which represent areas with an illumination intensity greater than a threshold value. In FIG. 4, the circular areas 23 have a smaller size, and there are areas in between the circular areas 23 with an intensity smaller than the specific threshold value. The character of this illumination profile is discrete and might lead to unsatisfactory illumination. By increasing the range of directions into which the sub-beams of the circular areas propagate, for example by using optics as described above or in connection with FIG. 6 below, the circular areas 23a are enlarged so as to overlap each other. As a result, the intensity distribution shown in FIG. 5 has approximately the shape of a parallelogram. Since the sub-beams of the projection beam can be directed to any desired place of the cross-sectional area, almost any intensity profile can be produced. However, it is also possible to produce standard intensity distributions, e.g. with an annular shape. In particular, the area 21 in between the inner and outer circles of FIGS. 4 and 5 can be filled with circular areas 23 or 23a. The so-called σ-inner and σ-outer can be adjusted by directing the sub-beams to the corresponding places between the respective inner circle and the respective outer circle.

Figure 6:
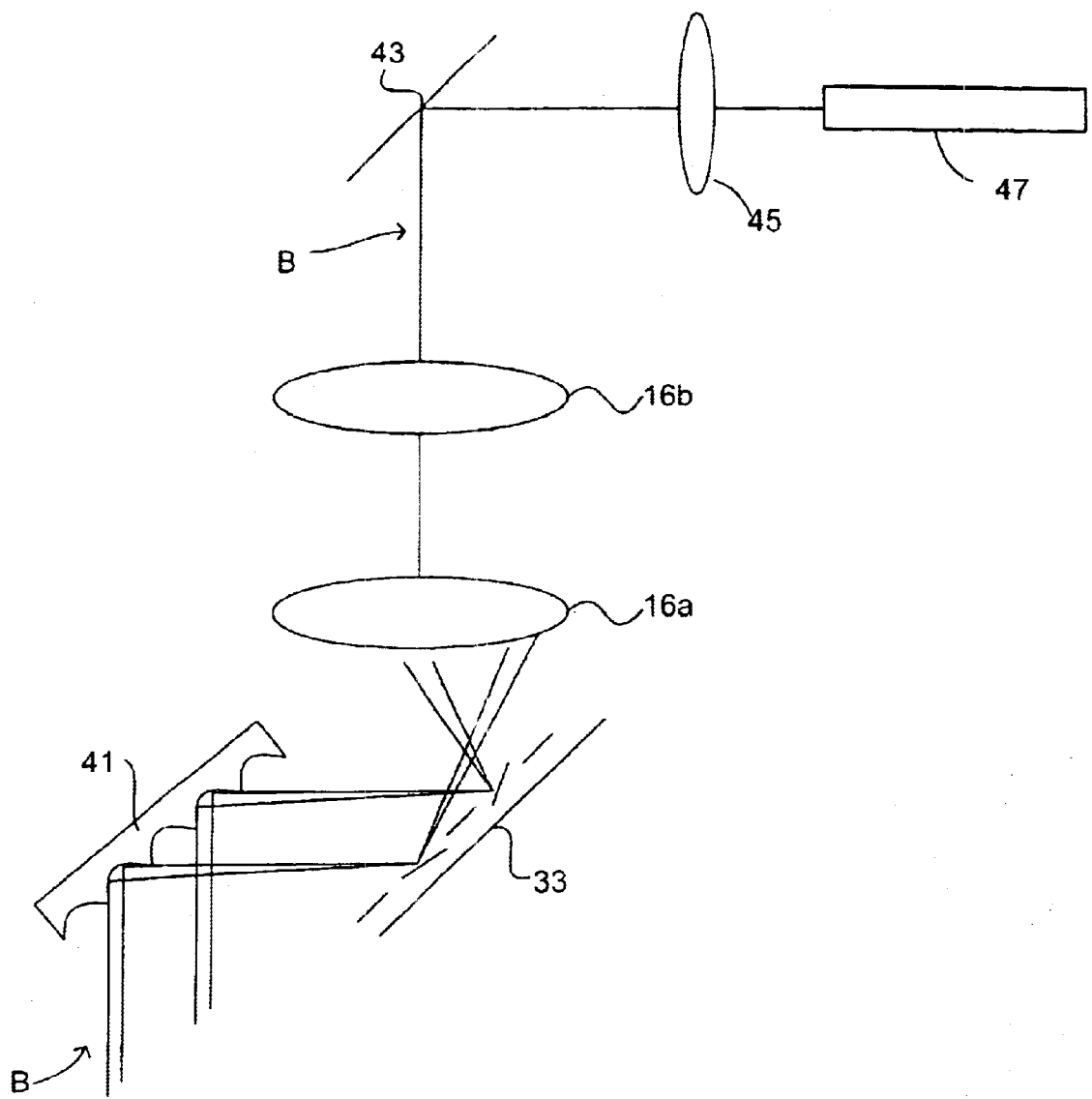
FIG. 6 shows the radiation system of a lithographic apparatus according to a second embodiment of the invention.

FIG. 6 shows a second embodiment of the present invention which may be the same as the first embodiment save as described below.

The beam B is incident at concentrating optics 41 which may be the same as the divergence optics 32 of FIG. 3. The concentrating optics 41 fulfill two functions. First, the sub-beams of the beam B are separated from each other. Second, the sub-beams are concentrated onto the reflective elements of the array 33. In particular, the concentration and separation is performed by reflective surface areas of the optics 41 with a parabolic or hyperbolic surface profile. It is preferred that surface areas which concentrate different parts of the projection beam onto different directing elements (reflective elements of the array 33, for example) are arranged side by side to each other so as to leave no gap in between. This means that a beam with a continuous intensity profile can be divided into separate sub-beams without significant loss of intensity.

The concentrating optics 41 may comprise a plurality of concentrating elements (not shown in FIG. 6) which are arranged at different locations along the propagation path of the beam B. For example, a first concentrating element concentrates the radiation with respect to a first direction perpendicular to the direction of propagation to produce continuous lines or bands of concentrated radiation. In this embodiment, a second concentrating element concentrates the lines or bands with respect to a direction perpendicular to the first direction and perpendicular to the direction of radiation propagation. One advantage of this embodiment is that the manufacturing of the concentrating elements is facilitated, in particular, when the concentrating reflective surface areas are to be arranged side by side without leaving a gap in between.

The concentrating of parts of the beam B corresponds to producing sub-beams which propagate into a defined range of directions. In the embodiment illustrated by FIG. 6, the sub-beams are reflected by the reflective elements of the array 33 to be incident at re-directing optics 16a, 16b. Downstream, the beam B (as represented in FIG. 6 by the optical axis where the intensity might be zero) is reflected by a mirror 43 and is then coupled into an integrator 47, e.g. a quartz rod, by coupling optics 45.

Figure 7:
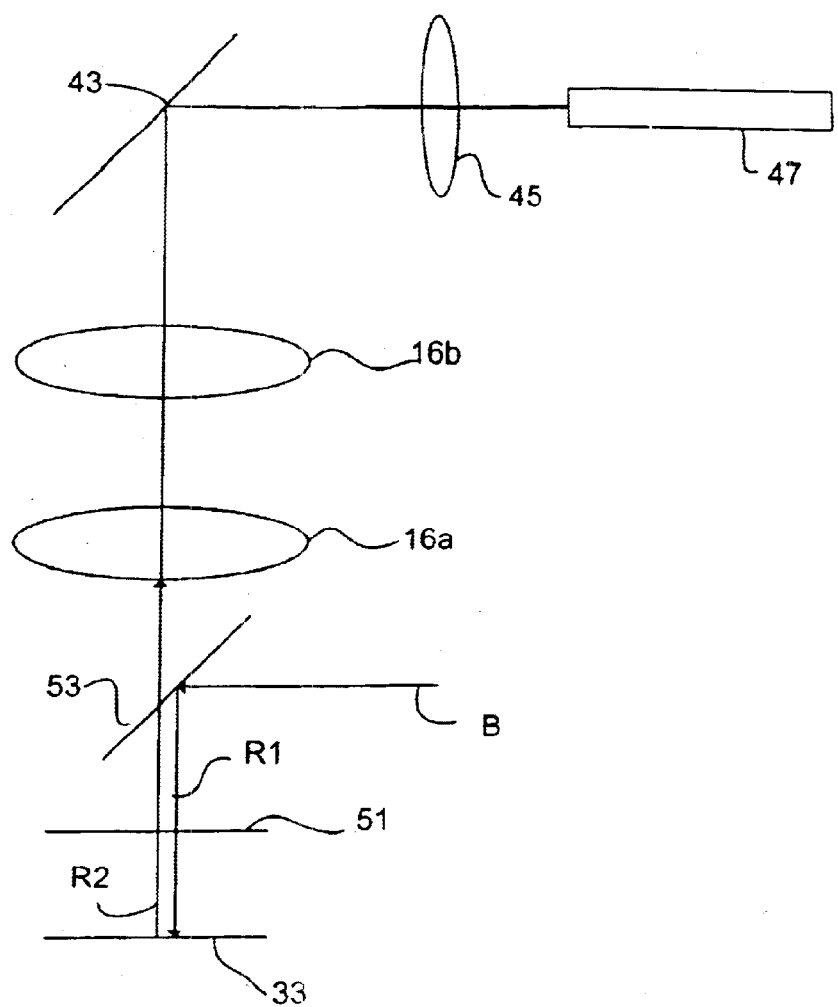
FIG. 7 shows the radiation system of a lithographic apparatus according to a third embodiment of the invention.

FIG. 7 depicts a third embodiment of the invention which may be the same as the first embodiment save as described below. A polarized incoming beam B is incident at a polarization dependent mirror 53. The polarization of the beam B is chosen so that a beam R1 is reflected (downwards in the illustration of FIG. 7). The polarization direction of the beam R1 is rotated when it transmits through a ¼ λ-plate 51. The beam R1 (with rotated polarization direction) is incident at the array 33. The corresponding sub-beams (not shown in FIG. 7) are reflected into different directions. These reflected sub-beams constitute beam R2 which transmits through the ¼ λ-plate 51 and, thereby, the polarization direction is again rotated. Due to the rotation of the polarization direction, beam R2 is not reflected by the polarization sensitive mirror 53, but transmits through. This embodiment allows for perpendicular illumination of the array of directing elements. Furthermore, the entire array is in the object plane of the rest of the beam shaping optics.

Figure 8:
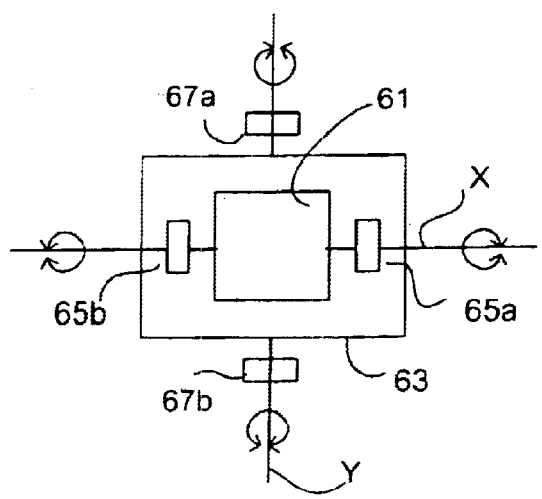
FIG. 8 depicts a reflective element useable in the first to third embodiments of the invention.

FIG. 8 shows an example of a reflective element. In particular, the array 33 of FIGS. 3, 6 and 7 comprises a plurality, for example more than 1,000, of such reflective elements which can be aligned side by side to each other in a cross-sectional plane of the projection beam PB. The reflective element comprises a reflective member 61 with a rectangular reflective surface area. In general, the reflective member can have any desired shape, for example a circular or hexagonal shape. The reflective member 61 can be rotated around a first axis X by means of actuators 65a, 65b, for example electromechanical actuators. As many actuators per axis as desired may be provided. The actuators 65a, 65b are fixed to the same support member 63. The support member 63 can also be rotated around a second axis Y by means of actuators 67a, 67b, for example electro-mechanical actuators. Again, as many actuators per axis as desired may be provided. Also, sensors to provide feedback control of the mirror positions can be provided. Thus, the orientation of the reflective member 61 can be adjusted so as to reflect an incident beam into any desired direction of a hemisphere. Further details concerning reflective elements of the type shown in FIG. 8 and of other types are disclosed in U.S. Pat. No. 6,031,946 (Lucent Technologies, Inc.), for example, incorporated herein by reference.

A fourth embodiment of the invention, which is the same as the first embodiment save as described below, employs faceted mirrors acting as a fly's-eye type integrator and is shown in FIGS. 9 to 15.

Figure 9:
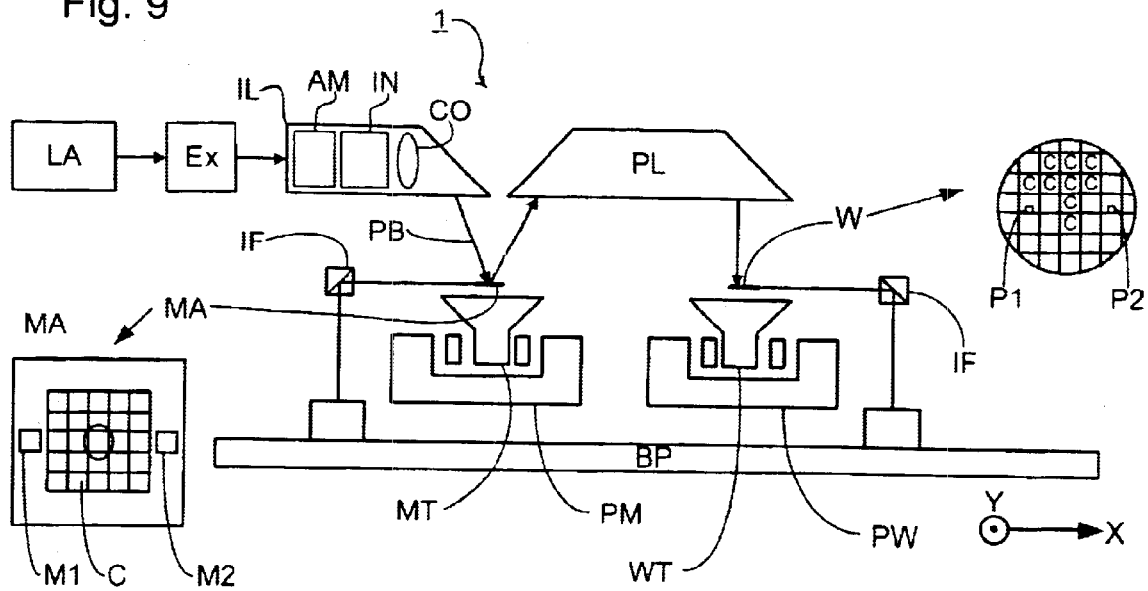
FIG. 9 depicts a lithographic projection apparatus according to a fourth embodiment of the invention.

FIG. 9 depicts the overall layout of the fourth embodiment, which contains essentially the same components as the first embodiment but arranged around a reflective mask MA. Such an apparatus may employ EUV as the radiation of the projection beam. The radiation and illumination system employ reflective optics.

Figure 10:
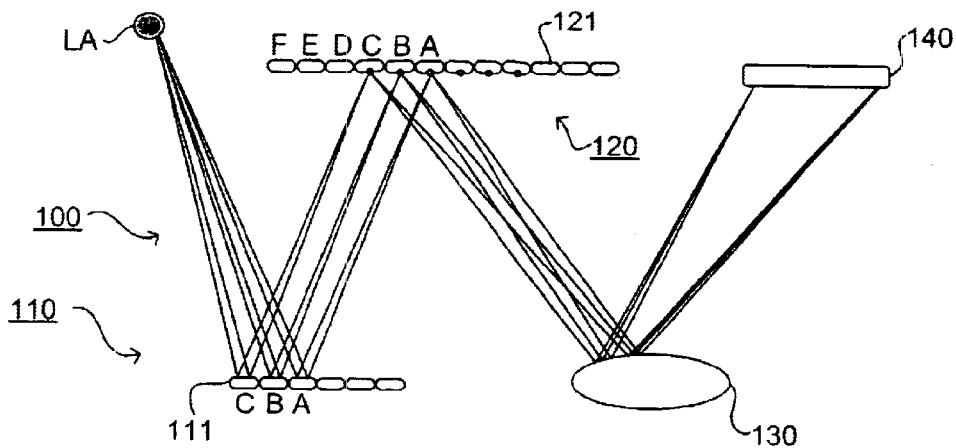
FIGS. 10 to 12 depict the radiation system of a lithographic apparatus according to the fourth embodiment of the invention in various different states.

The illumination system 100, shown in FIG. 10, comprises a field faceted mirror 110 which has a plurality of field facets 111, each of which might have the shape of the illumination field (except for curvature added elsewhere in the illumination system), which form images of the source LA on pupil faceted mirror 120. Note that the images do not have to be good quality, nor lie exactly on the pupil facetted mirror. The pupil facets 121 of pupil faceted mirror 120 direct the light to appropriately fill the illumination field on the mask 140, with the aid of condenser mirror 130 (which may be a system of mirrors), which images the field facets on the mask 140. Because the pupil facet mirror is in a conjugate plane of the pupil of the projection system PL, the illumination setting is determined by which of the pupil facets are illuminated. This is controlled by individually controlling the orientations of the field facets 111. Each facet is significantly moveable in Rx (rotation about the x-axis), Ry (rotation about the y-axis) and may be moveable in the z direction (x, y and z denoting directions of an orthogonal coordinate system with the z direction being the axis of the mirror). There are preferably more pupil facets than field facets.

FIG. 10 shows the field facets 111 in a neutral position in which each field facet 111 directs light onto a correspondingly located one of the pupil facets 120. Thus, in FIG. 10, field facets 111 labeled A, B and C direct light respectively to pupil facets 121 labeled A, B and C in the middle of the pupil faceted mirror 120. Though rays are not shown for clarity, the other three field facets direct light to the pupil facets marked with a dot. A conventional uniform illumination mode is thereby produced.

Figure 11:
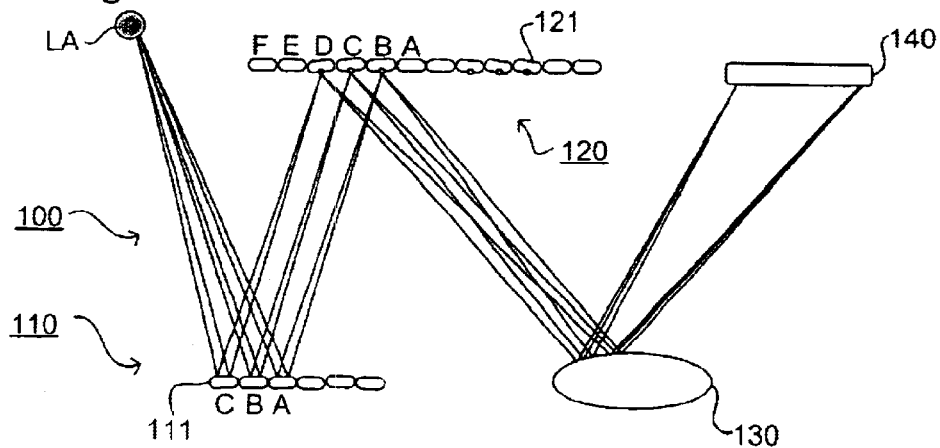

To generate an annular illumination mode, the field facets 111 are inclined by equal angles away from the center of the field facet mirror 110 and illuminate the next pupil facet along from their "neutral" position. Thus, as shown in FIG. 11, the field facets labeled A, B and C direct light to pupil facets B, C, D where D is the pupil facet outside facet C. As in FIG. 10, the three unlabelled filed facet mirrors direct light to the marked pupil facets, though for clarity the corresponding rays are not shown. Facet A, which is not central in the pupil faceted mirror 120, is not illuminated. The pupil facets 121 B, C and D are also tilted to accommodate the slight change in angle of incidence of the radiation from the inclined field facets whilst still correctly distributing the radiation into the illumination field.

Figure 12:
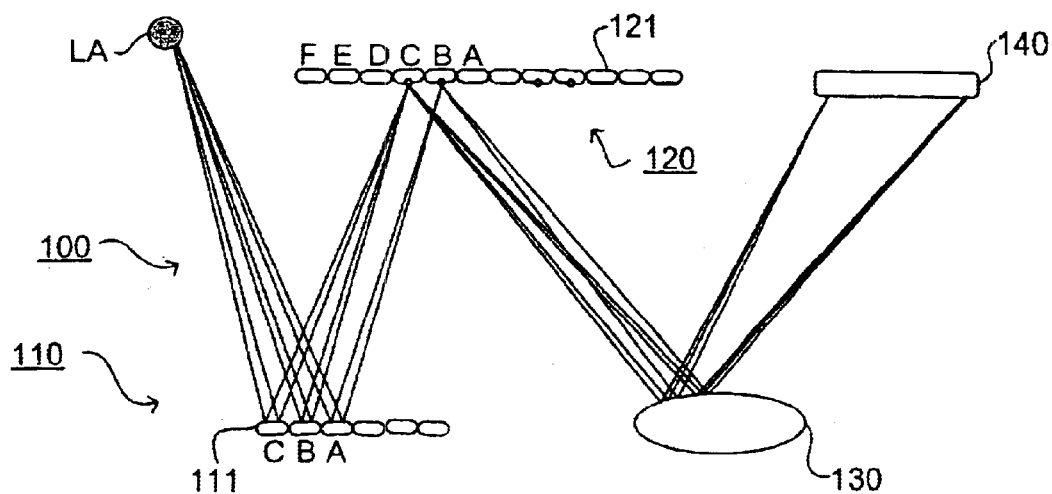

An annular illumination mode with a narrower annulus can be created by inclining field facet 111C to direct radiation onto pupil 121C, at the same time as does field facet 111B, as shown in FIG. 12. Field facet 111A directs radiation onto pupil facet 121B. It will be appreciated that pupil facet 121C cannot be perfectly oriented to direct light from two different angles of incidence into the illumination field. Thus there may be some small loss of intensity, but much less than if different illumination modes are effected by selectively obscuring the beam. Also, there may be a small change in the intensity profile of the illumination slit. If the field produced by each pupil facet 121 is smaller than the illumination field at the mask, which is made up by a large number of overlapping fields produced by the individual pupil facets 121, then it may be possible to position the pupil facet 121C at a position such that there is no radiation loss.

It will be appreciated that in practice there will be a much larger number of facets in the field and pupil faceted mirrors than shown in FIGS. 10 to 12 so that a much larger range of illumination settings can be achieved by applying the principles discussed above. Also, the field facets may be inclined so as to redirect light tangentially as well as radially to create illumination modes such as quadrupole and dipole, or more complex illumination modes optimized for specific mask patterns. If the reaction times of the tiltable facets are sufficiently fast, the illumination mode may be changed during an exposure or between shots of a multi-shot exposure, e.g. using a pulsed radiation source.

Figure 13:
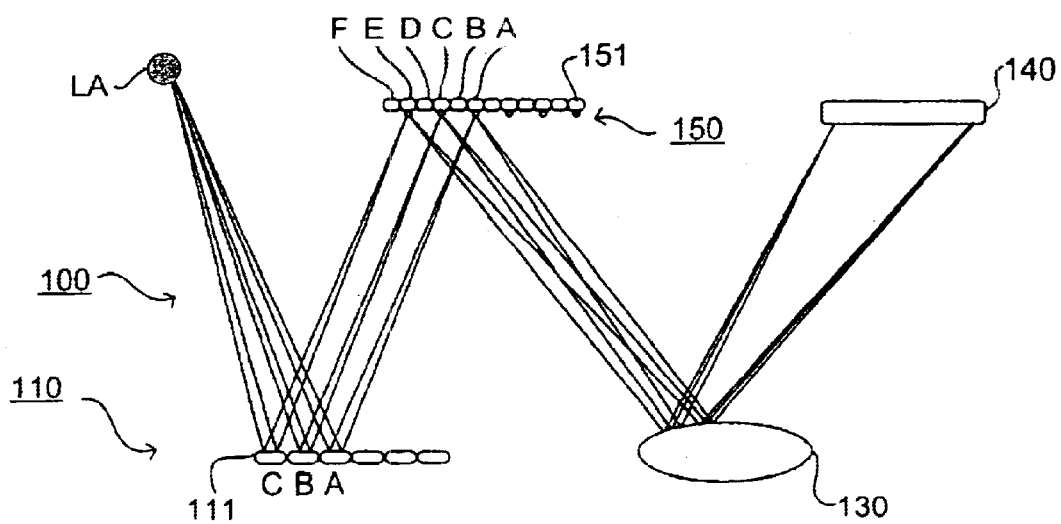
FIG. 13 depicts the radiation system of a lithographic apparatus according to a variant of the fourth embodiment.

A radiation system according to a variant of the fourth embodiment is shown in FIG. 13. In this variant, the pupil facets 151 are made smaller and at least twice as many as there are field facets are provided. The source images projected by the field facets are also made correspondingly smaller. In this variant, the illumination mode can be changed with smaller step sizes and illumination modes can be arranged such that each pupil facet 151 receives only radiation for one field facet 111 avoiding the problems arising when a pupil facet receives radiation from more than one incident angle and cannot be optimally positioned. The pupil facets in this variant may be grouped in pairs, or larger numbers, with the different members of a group oriented to receive radiation from a different angle of incidence so that it is not necessary to shift the pupil facets as the inclination of the field facets is changed.

Figure 14A:
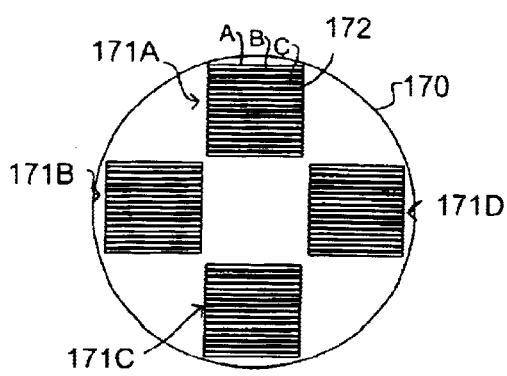
FIGS. 14A & 14B depict field and pupil faceted mirrors of the fourth embodiment of the invention.
Figure 14B:
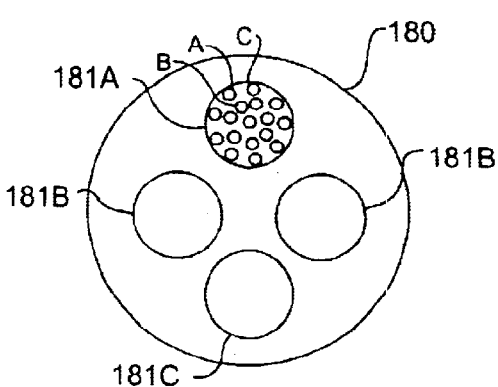

In a further variant of the fourth embodiment, shown in FIGS. 14A and B, the field faceted mirror 170 comprises several, in this case four, arrays 171 A–D of facets 172. Each of field facets 172 A, B, C etc. directs radiation onto a corresponding pupil facet 182 A, B, C etc. in a corresponding array 181A on pupil faceted mirror 180. Different illumination modes are set by tilting the field facet arrays 171 A–D as a whole and correspondingly displacing and tilting the pupil facet arrays 181 A–D radially, or in other directions. In this arrangement, because four arrays are used, illumination modes from conventional, to quasi-annular to quadrupole can be obtained. A larger number of arrays allows additional modes.

Figure 15:
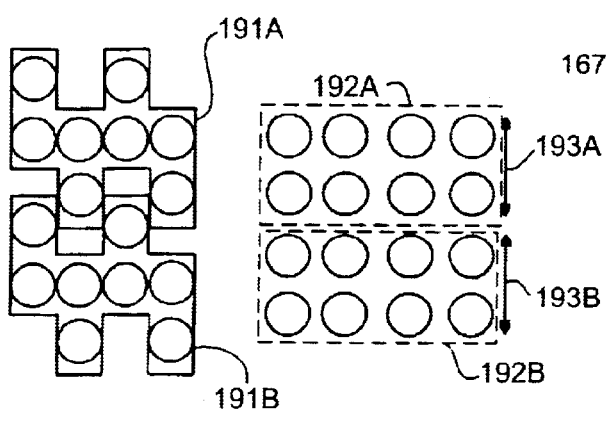
FIG. 15 depict grouped facets according to a variant of the fourth embodiment.

With arrays of field facets tilted as a whole, illumination modes can be set continuously by using arrays in an interlaced meander, as shown in FIG. 15. The two arrays 191A, 191B meander in one direction and are interlaced. The arrays 191A, 191B direct radiation to groups of pupil facet mirrors 192A, 192B which have overlapping ranges of movement 193A, 193B. A meander in two directions is also possible. Note that it is not necessary for both the pupil or facet mirrors to be grouped, nor, if both are grouped, for the grouping to be the same.

Figure 16:
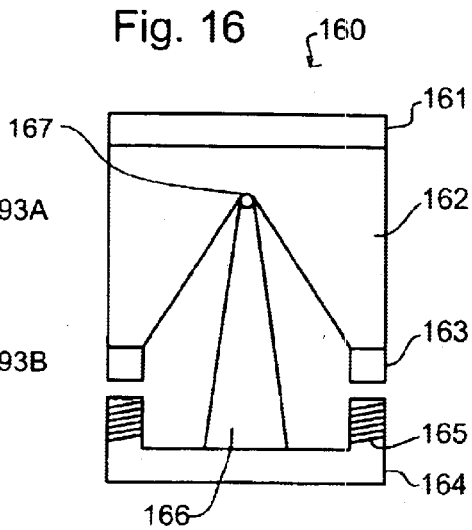
FIG. 16 depicts a controllable facet useable in the fourth embodiment of the invention.

A tiltable facet mirror 160 useable in the above embodiment and variants, is shown in cross-section in FIG. 16. The facet mirror 161, which may comprise a tuned multilayer stack on a substrate, is mounted on frame 162 which has a conical central recess and an iron ring 163 around its lower rim. A magnet frame 164 carries a pin 166 which is tipped with a ball 167 on which the conical recess of the frame 162 rests to make a joint which has high positional stability. The facet is actuated by a plurality of coils 165, at least three, spaced around the magnet frame and which exert forces on the iron ring 163 to tilt the frame 162 and hence the mirror 161.

Figure 17:
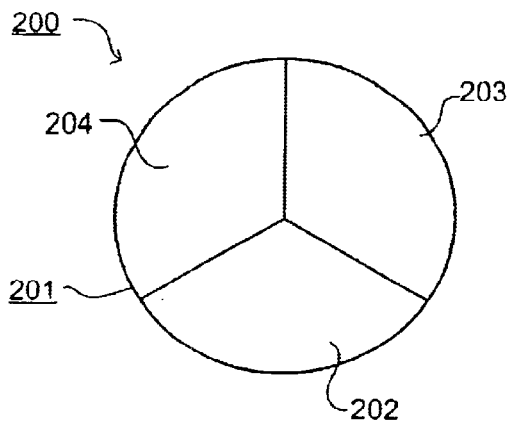
FIGS. 17 and 18 depict an alternative form of controllable facet useable in the fourth embodiment of the invention.
Figure 18:
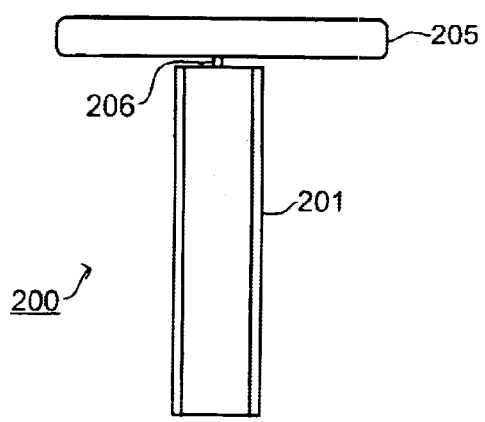

An alternative form of tiltable facet mirror 200 is shown in FIGS. 17 and 18 of which FIG. 17 is a lateral cross-section through the leg of the mirror 200 and FIG. 18a side view. The mirror 205, again which may be a tuned multilayer stack on a substrate, is supported via an electric hinge 206 by leg 201. Leg 201 is formed of piezo-electric material and divided into three equal sectors 202, 203, 204 which can be separately actuated to bend the leg 201 in a selected direction and hence tilt the mirror 205.

While specific embodiments of the invention have been described above, it will be appreciated that the invention may be practiced otherwise than as described. The description is not intended to limit the invention.

We claim:

1. A lithographic projection apparatus, comprising:
   a radiation system constructed and arranged to provide a projection beam of radiation;
   a support structure constructed and arranged to support a patterning device, the patterning device constructed and arranged to pattern the projection beam according to a desired pattern;
   a substrate table to hold a substrate;
   a projection system constructed and arranged to project the patterned beam onto a target portion of the substrate; wherein the radiation system comprises an illumination system configured to define the intensity distribution of the projection beam, the illumination system comprises a steering device constructed and arranged to individually steer different parts of an incoming radiation beam into different directions to provide a desired angular intensity distribution of the projection beam at the patterning device, said steering device comprising a plurality of discrete reflectors, each for steering a part of the incoming beam, and whose orientation can be controlled individually to direct the corresponding part of the incoming beam into a desired direction.

2. An apparatus according to claim 1, wherein the illumination system further comprises re-directing elements to re-direct at least a part of the incoming beam and to produce a spatial intensity distribution in a cross-section of the incoming beam which corresponds to said angular intensity distribution.

3. An apparatus according to claim 2, wherein the cross-section is in a pupil plane.

4. An apparatus according to claim 2, wherein the illumination system further comprises a widening device that widens the range of directions into which the incoming beam propagates.

5. An apparatus according to claim 4, wherein the widening device comprises a diffuser device.

6. An apparatus according to claim 5, wherein the diffuser device is a diffuser plate.

7. An apparatus according to claim 1, wherein the discrete reflectors are arranged side by side to each other in a cross-sectional area of the incoming beam.

8. An apparatus according to claim 1, wherein the illumination system further comprises a concentrating device constructed and arranged to concentrate parts of the incoming beam onto the discrete reflectors.

9. An apparatus according to claim 8, wherein the concentrating device comprises a reflective surface area having one of a parabolic and a hyperbolic cross-sectional shape and an array of one of hyperbolic and parabolic reflective surfaces.

10. An apparatus according to claim 1, wherein said steering device comprises a first faceted reflector, each of the discrete reflectors being a facet of the first faceted reflector and constructed and arranged to project an image of a radiation source onto a selected facet of a second faceted reflector by control of the orientation thereof.

11. An apparatus according to claim 10, further comprising an actuator for each of said discrete reflectors constructed and arranged to change its orientation by rotation about two axes substantially perpendicular to the optical axis of that discrete reflector.

12. An apparatus according to claim 11, wherein the two axes are orthogonal.

13. An apparatus according to claim 10, wherein each facet of said second facet is also controllable in orientation.

14. An apparatus according to claim 1, wherein said steering device comprises a first faceted reflector, each of the discrete reflectors being an array of facets of the first faceted reflector, each facet of the first faceted reflector constructed and arranged to project an image of a radiation source onto a facet of a second faceted reflector.

15. An apparatus according to claim 10, wherein said second faceted reflector has more facets than said first faceted reflector.

16. An apparatus according to claim 10, wherein said second faceted reflector is located substantially in a conjugate plane of a pupil of said projection system.

17. A device manufacturing method, comprising:
    providing a substrate at least partially with a layer of radiation-sensitive material;
    providing at least one projection beam of radiation;
    modifying the intensity distribution of the projection beam;
    using a patterning device to endow the modified projection beam with a pattern in its cross-section;
    projecting the patterned beam of radiation onto a target which comprises at least a part of the radiation-sensitive material, wherein the modification of the intensity distribution of the projection beam includes controlling the direction into which the radiation propagates, wherein the projection beam comprises a plurality of sub-beams, wherein at least some of the sub-beams are steered into different directions using a plurality of discrete reflectors, and wherein the discrete reflectors are individually controlled to direct the corresponding sub-beam into a desired direction.

18. A method according to claim 17, wherein a desired angular intensity distribution of radiation propagation at the patterning device is produced by steering the sub-beams, wherein the steered sub-beams contribute to a desired spatial intensity distribution of the projection beam in its cross-section, and wherein each of said different directions of radiation propagation corresponds to one particular area of the spatial intensity distribution in said cross-section.

19. A method according to claim 18, wherein the one particular area is one specific local point in a local plane.

20. A method according to claim 18, wherein at least one of the sub-beams is manipulated before it is steered so that the steered sub-beam propagates into a defined range of propagation directions.

21. A method according to claim 18, wherein the steered sub-beams each propagate essentially into a single direction.

22. A method according to claim 20, wherein the defined range of propagation directions of at least one of the steered sub-beams is increased so that the at least one steered sub-beam corresponds to an increased area of said spatial intensity distribution.

23. A computer program product comprising a computer able medium having stored thereon a computer readable program code, wherein the gram code enables the computer to perform the method according to claim 20.

* * * * *